(12) United States Patent
Liu et al.

(10) Patent No.: US 6,861,895 B1
(45) Date of Patent: Mar. 1, 2005

(54) HIGH VOLTAGE REGULATION CIRCUIT TO MINIMIZE VOLTAGE OVERSHOOT

(76) Inventors: Ping-Chen Liu, 39577 Canyon Heights Dr., Fremont, CA (US) 94539; Asim A. Bajwa, 4955 Fontanelle Pl., San Jose, CA (US) 95111

( * ) Notice: Subject to any disclaimer, the term of this patent is extended or adjusted under 35 U.S.C. 154(b) by 0 days.

(21) Appl. No.: 10/464,129

(22) Filed: Jun. 17, 2003

(51) Int. Cl.[7] .................................................. G05F 3/02
(52) U.S. Cl. ........................................ 327/536; 327/565
(58) Field of Search ................................. 327/306, 329, 327/308–312, 379, 538–541, 543, 557–559, 564–566

(56) References Cited

U.S. PATENT DOCUMENTS

| | | | | | |
|---|---|---|---|---|---|
| 5,081,371 A | * | 1/1992 | Wong | ............................ | 327/536 |
| 5,283,762 A | * | 2/1994 | Fujishima | ............... | 365/189.09 |
| 5,309,399 A | * | 5/1994 | Murotani | ................ | 365/189.09 |
| 5,367,249 A | * | 11/1994 | Honnigford | .................. | 323/313 |
| 5,497,119 A | * | 3/1996 | Tedrow et al. | ............... | 327/540 |
| 5,589,790 A | * | 12/1996 | Allen | ........................... | 327/333 |
| 5,796,296 A | * | 8/1998 | Krzentz | ....................... | 327/545 |
| 5,831,302 A | * | 11/1998 | McIntyre | ..................... | 323/313 |
| 6,008,674 A | * | 12/1999 | Wada et al. | ................... | 327/89 |
| 6,069,518 A | * | 5/2000 | Nakai et al. | ................. | 327/535 |
| 6,147,549 A | * | 11/2000 | Ohno | ........................... | 327/541 |
| 6,229,379 B1 | * | 5/2001 | Okamoto | ..................... | 327/535 |
| 6,404,232 B1 | * | 6/2002 | Mizuno et al. | ............... | 326/81 |
| 6,573,765 B2 | * | 6/2003 | Bales et al. | .................. | 327/108 |
| 6,724,241 B1 | * | 4/2004 | Bedarida et al. | ............ | 327/536 |

* cited by examiner

*Primary Examiner*—Timothy P. Callahan
*Assistant Examiner*—Hai L. Nguyen
(74) *Attorney, Agent, or Firm*—E. Eric Hoffman; Edel M. Young; Justin Liu

(57) ABSTRACT

A resistive divider for a voltage multiplier circuit minimizes output voltage overshoot by capacitively coupling the tap point of the resistive divider to the output terminal of the voltage multiplier circuit via the parasitic capacitance of the resistive divider. For a resistive divider that includes a resistive structure formed over a dielectric layer formed on a doped well, this capacitive coupling can be performed by connecting the well to the output terminal of the voltage multiplier circuit. This capacitive coupling improves the response time of the resistive divider, so that a scaled test voltage read from the tap point varies more rapidly than the elevated output voltage of the voltage multiplier circuit. Therefore, the scaled test voltage provides charging control that increases the elevated output voltage in gradual increments that prevent the elevated output voltage from exceeding a target output voltage.

34 Claims, 7 Drawing Sheets

HIGH VOLTAGE REGULATION CIRCUIT TO MINIMIZE VOLTAGE OVERSHOOT

FIELD OF THE INVENTION

The present invention relates to voltage generation circuits, and in particular to a voltage regulation circuit for improving output voltage accuracy.

BACKGROUND OF THE INVENTION

Voltage multiplier circuits are used in integrated circuits (ICs) to generate voltages that are greater than the IC supply voltage. A voltage multiplier circuit includes a charging circuit (e.g., a charge pump) and a feedback control circuit. The charging circuit charges a capacitive structure to generate an elevated output voltage, while the feedback control circuit monitors the elevated output voltage and enables or disables the charging circuit to regulate the output voltage. Because the elevated output voltage is greater than the supply voltage to the IC, the feedback control circuit must scale down the elevated output voltage so that it can be compared with a non-elevated reference voltage. Typically, the scaling down of the elevated output voltage is performed using a resistive divider.

FIG. 1 shows a circuit diagram of a conventional voltage multiplier circuit 100 for providing an elevated output voltage $V_{PP}$ to a load 120. Voltage multiplier circuit 100 includes a charge pump 110, a resistive divider 130, and a comparator 190. Charge pump 110 receives an input voltage $V_{DD}$ (i.e., an internal supply voltage of the IC in which voltage multiplier circuit 100 is implemented) at an input terminal IN, which charges up an internal capacitor (not shown) to generate an elevated output voltage $V_{PP}$ at an output terminal OUT. To regulate elevated output voltage $V_{PP}$, resistive divider 130 generates a scaled down voltage $V_{SCALE}$ that is proportional to elevated output voltage $V_{PP}$. Comparator 190 then compares scaled down voltage $V_{SCALE}$ to a predetermined reference voltage $V_{REF}$ to generate a charging enable signal CHARGE, which is fed to an enable terminal EN of charge pump 110 to control the charging operation of charge pump 110. Therefore, the relative values of scaled down voltage $V_{SCALE}$ and reference voltage $V_{REF}$ determine the behavior of charge pump 110.

To generate scaled down voltage $V_{SCALE}$, resistive divider 130 includes a series of resistors 131–138 that are connected between output terminal OUT of charge pump 110 and ground. Scaled down voltage $V_{SCALE}$ is read from a tap point T within this series of resistors, and is therefore defined by the particular resistance values of resistors 131–138. For example, if resistors 131–138 all have the same resistance, then the voltage drop across each resistor is the same, and scaled down voltage $V_{SCALE}$ is equal to one eighth of elevated output voltage $V_{PP}$. Reference voltage $V_{REF}$ would then be set equal to one eighth of a target output voltage $V_{TAR}$ (i.e., the elevated voltage required by load 120), in which case comparator 190 would assert charging enable signal CHARGE until scaled down voltage $V_{SCALE}$ rose to one eighth of target voltage $V_{TAR}$. For example, for a target output voltage $V_{TAR}$ of 8V, reference voltage $V_{REF}$ would typically be set to 1.0V (i.e., 8V/8), in which case charging enable signal CHARGE would be asserted while scaled down voltage $V_{SCALE}$ was less than 1.0V, and charging enable signal CHARGE would be deasserted once scaled down voltage $V_{SCALE}$ reached 1.0V.

However, during a charging operation resistive divider 130 is not in a steady state condition, and so scaled down voltage $V_{SCALE}$ does not represent the actual level of elevated output voltage $V_{PP}$ during the charging operation. This is because a conventional resistive divider circuit such as resistive divider 130 typically experiences a voltage propagation lag across the individual resistors making up the divider circuit due to parasitic capacitances associated with the resistors (indicated by capacitances 141–148).

This voltage propagation lag is proportional to the resistance and parasitic capacitance values associated with the resistive divider. Unfortunately, resistive dividers are typically assigned large resistance values to minimize power loss through the circuit. The larger the resistance of the resistive divider, the smaller the parasitic current flow though the resistive divider, and the smaller the power consumption of that resistive divider. A resistive divider for a charge pump feedback control circuit generally has a resistance in the mega-ohm range, which results in microampere parasitic currents. To create such large resistances in an IC, large resistive elements are required, which in turn create large parasitic capacitances.

For example, FIG. 2 shows a layout diagram for a conventional resistive divider 200 for a voltage multiplier circuit (such as resistive divider 130 shown in FIG. 1). Resistive divider 200 includes a polysilicon resistor 230 formed on a dielectric layer 220 over an N-well 210. Polysilicon resistor 230 is connected between elevated output voltage $V_{PP}$ from a charge pump (not shown for clarity) and ground. Scaled down voltage $V_{SCALE}$ is read from a tap point T at an interior location of polysilicon resistor 230, and is therefore determined by the specific location of tap point T along the length of polysilicon resistor 230. The closer tap point T is to the grounded end of polysilicon resistor 230, the smaller scaled down voltage $V_{SCALE}$ becomes relative to elevated output voltage $V_{PP}$.

Because n-well 210 cannot be left floating, N-well 210 is grounded via well contacts 241 and 242, which are formed on dielectric layer 211 but are connected to N-well 210 by a plurality of interconnects 243. Unfortunately, because N-well 210 and polysilicon resistor 230 are separated by a dielectric layer, the grounding of N-well 210 capacitively couples polysilicon resistor 230 to ground. Returning to FIG. 1, this capacitive coupling is indicated by capacitors 141–148. As noted above, this capacitive coupling is problematic because it creates a voltage propagation delay through resistive divider 130. The delay is proportional to a time constant RC defined by the following formula:

$$RC = Rprev * Cprev \qquad (1)$$

where Rprev is the total resistance of the resistive divider between tap point T and the output terminal OUT of charge pump 110, and Cprev is the total parasitic capacitance associated with Rprev. For example, as depicted in FIG. 1, resistance Rprev would be defined by:

$$Rprev = R131 + R132 + R133 + R134 + R135 + R136 + R137 \qquad (2)$$

where R(xxx) represents the resistance of resistor xxx. Meanwhile, parasitic capacitance Cprev would be defined by:

$$Cprev = C131 + C132 + C133 + C134 + C135 + C136 + C137 \qquad (3)$$

where C(xxx) represents the capacitance of capacitor xxx.

Thus, because the resistance of resistive divider 130 is increased to minimize parasitic current loss through resistive divider 130, the parasitic capacitance associated with resistive divider 130 is increased, which in turn increases the voltage propagation delay through resistive divider 130. This propagation delay means that comparator 190 deasserts charging enable signal CHARGE at some point in time after elevated output voltage $V_{PP}$ has reached target output voltage $V_{TAR}$. Because charge pump 110 continues to perform charging operations during this charging lag interval (i.e., during the time after elevated output voltage $V_{PP}$ has reached target output voltage $V_{TAR}$ but before scaled down voltage $V_{SCALE}$ has reached reference voltage $V_{REF}$), elevated output voltage $V_{PP}$ can become significantly greater than target output voltage $V_{TAR}$ by the time charging enable signal CHARGE is deasserted. This overshoot of target output voltage $V_{TAR}$ by elevated output voltage $V_{PP}$ can result in damage to thin oxides and other structures within load 120. The problem is exacerbated by the fact that if load 120 does not have a high current draw, the only way for elevated output voltage $V_{PP}$ to be reduced is by current flow through the high resistance resistive divider 130, which has been expressly configured to minimize such parasitic current flow. Therefore, once overcharging has occurred, elevated output voltage $V_{PP}$ tends to remain in that overcharged state for a significant duration.

FIG. 3A shows a sample graph of elevated output voltage $V_{PP}$ versus time for a conventional voltage multiplier circuit (such as voltage multiplier circuit 100 shown in FIG. 1). FIGS. 3B and 3C show corresponding graphs of voltage $V_{SCALE}$ versus time and charging enable signal CHARGE versus time, respectively. When charging enable signal CHARGE is initially asserted (i.e., placed in the ON state) at time T0, elevated output voltage $V_{PP}$ begins rising as the charge pump in the voltage multiplier circuit begins charging. Consequently, voltage $V_{SCALE}$ also begins rising as elevated output voltage $V_{PP}$ increases the voltage across the resistive divider in the voltage multiplier circuit. However, as described above, the response of the resistive divider lags elevated output voltage $V_{PP}$, so when elevated output voltage $V_{PP}$ reaches target voltage $V_{TAR}$ at time T1, scaled down voltage $V_{SCALE}$ is still at an interim voltage $V_{INT}$ that is less than reference voltage $V_{REF}$. Therefore, even though elevated output voltage $V_{PP}$ has reached target voltage $V_{TAR}$, the charge pump continues its charging operation until scaled down voltage $V_{SCALE}$ reaches reference voltage $V_{REF}$ at time T2 and charging enable signal CHARGE is deasserted (i.e., placed in the OFF state). However, by this time, output voltage $V_{PP}$ has risen to an overshoot voltage $V_{OVR}$ that is greater than target voltage $V_{TAR}$, which can lead to IC damage and reliability problems. Note that elevated output voltage $V_{PP}$ decreases very slowly after charge pump operation has ceased (i.e., after time T2) due to the large resistances used in the resistive divider (as described above).

To overcome this overcharging problem, conventional voltage multiplier circuits are typically customized for specific load characteristics. For example, for a small capacitive load (i.e., a load that does not require substantial current flow), a charge pump having a relatively small capacitive structure can be operated at a relatively low charging frequency to minimize the chances of output voltage overshoot. However, such a voltage multiplier would not be suitable for loads requiring increased current flow. Such high-current loads would require a larger capacitive structure in the charge pump and a higher charging frequency to supply the higher current demands. But this type of "high capacity" voltage multiplier circuit could not be used with a small capacitive load, as the higher charging frequency would cause greater output voltage overshoot and the lack of current draw by the load would leave only the slow charge dissipation via the resistive divider. Thus, to minimize the effects of output voltage overshoot, conventional voltage multiplier circuits must be individually designed for each different load being serviced.

Accordingly, it is desirable to provide a voltage multiplier circuit that minimizes output voltage overshoot and can be used with a variety of output loads.

SUMMARY OF THE INVENTION

The invention uses the parasitic capacitance inherent in a semiconductor resistive divider structure to capacitively couple the semiconductor resistive divider structure to an elevated voltage (i.e., the voltage being scaled by the resistive divider structure). According to an embodiment of the invention, the well over which the resistive divider structure is formed can be connected to the elevated voltage. This "well-biasing" improves the response time of the resistive divider structure since the small parasitic capacitance is rapidly charged by the elevated voltage (and is rapidly discharged by the resistive divider structure).

According to an embodiment of the invention, a voltage multiplier circuit can include a charging circuit for generating an elevated output voltage, and a well-biased resistive divider structure for scaling the elevated output voltage to generate a scaled down voltage that is used to control the operation of the charging circuit. The enhanced response time of the resistive divider structure means that the scaled down voltage varies much more rapidly than the elevated output voltage. Therefore, when the charging circuit is activated and increases the elevated output voltage, the scaled down voltage increases even more rapidly, and the charging circuit is deactivated before the elevated output voltage reaches the desired target output voltage. Once the charging circuit is deactivated, the scaled down voltage decreases much more rapidly than the elevated output voltage, so that the charging circuit is reactivated before the elevated output voltage can significantly decrease. This intermittent charging operation gradually steps up the elevated output voltage until the target output voltage is reached.

Because the elevated output voltage is increased in this "stepped" fashion by the faster-acting scaled down voltage, the output voltage overshoot problems associated with conventional voltage multiplier circuits are minimized, even when using a high charging frequency. Therefore, the voltage multiplier circuit can be used with any type of output load, which beneficially eliminates the need to customize voltage multiplier circuits for different loads.

According to an embodiment of the invention, the voltage multiplier circuit can include an output load selection circuit for switching the output of the voltage multiplier circuit among different output loads. According to another embodiment of the invention, the voltage multiplier circuit can include a tap selection circuit for choosing the point along the resistive divider from which the scaled down voltage is read, thereby allowing different scaled down voltages to be read from the resistive divider.

The invention will be more fully understood in view of the following description and drawings.

DETAILED DESCRIPTION OF THE DRAWINGS

Figure 4:
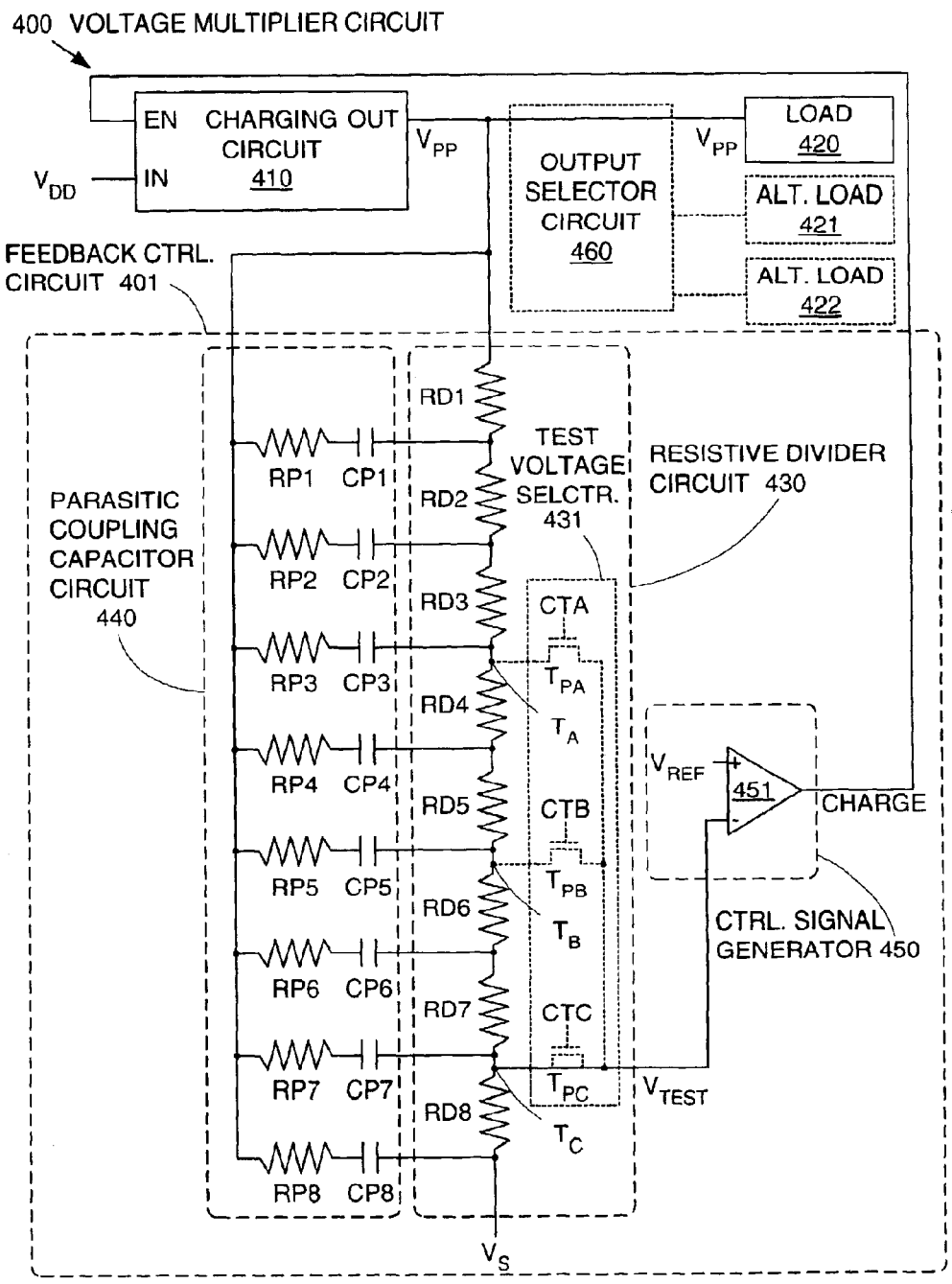
FIG. 4 is a schematic diagram of a voltage multiplier circuit in accordance with an embodiment of the invention.

FIG. 4 shows a circuit diagram of a voltage multiplier circuit 400 in accordance with an embodiment of the invention. Voltage multiplier circuit 400 comprises a charging circuit 410 for generating an elevated output voltage $V_{PP}$ from an input voltage $V_{DD}$, an optional output selector circuit 460 for providing elevated output voltage $V_{PP}$ to a load 420 (and optional alternative loads 421 and 422), and a feedback control circuit 401 for regulating the charging operation of charging circuit 410.

Charging circuit 410 can comprise any circuit for creating an elevated output voltage from an input voltage having a lower magnitude (e.g., a charge pump). Note that while the invention will be described with respect to a positive elevated output voltage $V_{PP}$ for the sake of clarity, elevated output voltage $V_{PP}$ could just as well comprise a negative elevated output voltage.

Feedback control circuit 401 comprises a resistive divider circuit 430 connected between elevated output voltage $V_{PP}$ and a secondary voltage $V_S$ (such as ground), a control signal generator 450, and a parasitic capacitance coupling circuit 440. Secondary voltage $V_S$ can comprise any voltage having a magnitude less than the magnitude of elevated output voltage $V_{PP}$ (i.e., voltage $V_S$ is less than voltage $V_{PP}$ for a positive elevated output voltage, and voltage $V_S$ is greater than voltage $V_{PP}$ for a negative elevated voltage), since such an arrangement will allow resistive divider circuit 430 to scale elevated output voltage $V_{PP}$. However, note that since the magnitude of elevated output voltage $V_{PP}$ is greater than the magnitude of input voltage $V_{DD}$ (since charging circuit 410 uses voltage $V_{DD}$ to create voltage $V_{PP}$), secondary voltage $V_S$ will typically have a magnitude less than the magnitude of input voltage $V_{DD}$.

Resistive divider circuit 430 comprises a plurality of resistive elements RD1, RD2, RD3, RD4, RD5, RD6, RD7, and RD8, connected serially between elevated output voltage $V_{PP}$ and supply voltage $V_S$ in a resistive divider configuration. Note that while eight resistive elements are shown for explanatory purposes, resistive divider circuit 430 can comprise any number of resistive elements.

Resistive divider circuit 430 also includes an optional test voltage selector 431 for choosing the tap point from which test voltage $V_{TEST}$ is to be read. For example, as depicted in FIG. 4, test voltage selector 431 includes pass transistors $T_{PA}$, $T_{PB}$, and $T_{PC}$ connected between tap points $T_A$, $T_B$, and $T_C$, respectively, and the output of resistive divider circuit 430. By asserting control signal CTA, CTB, or CTC, test voltage selector 431 can provide test voltage $V_{TEST}$ from a different tap point $T_A$, $T_B$, or $T_C$, respectively, via pass transistor $T_{PA}$, $T_{PB}$, or $T_{PC}$, respectively.

Figure 1:
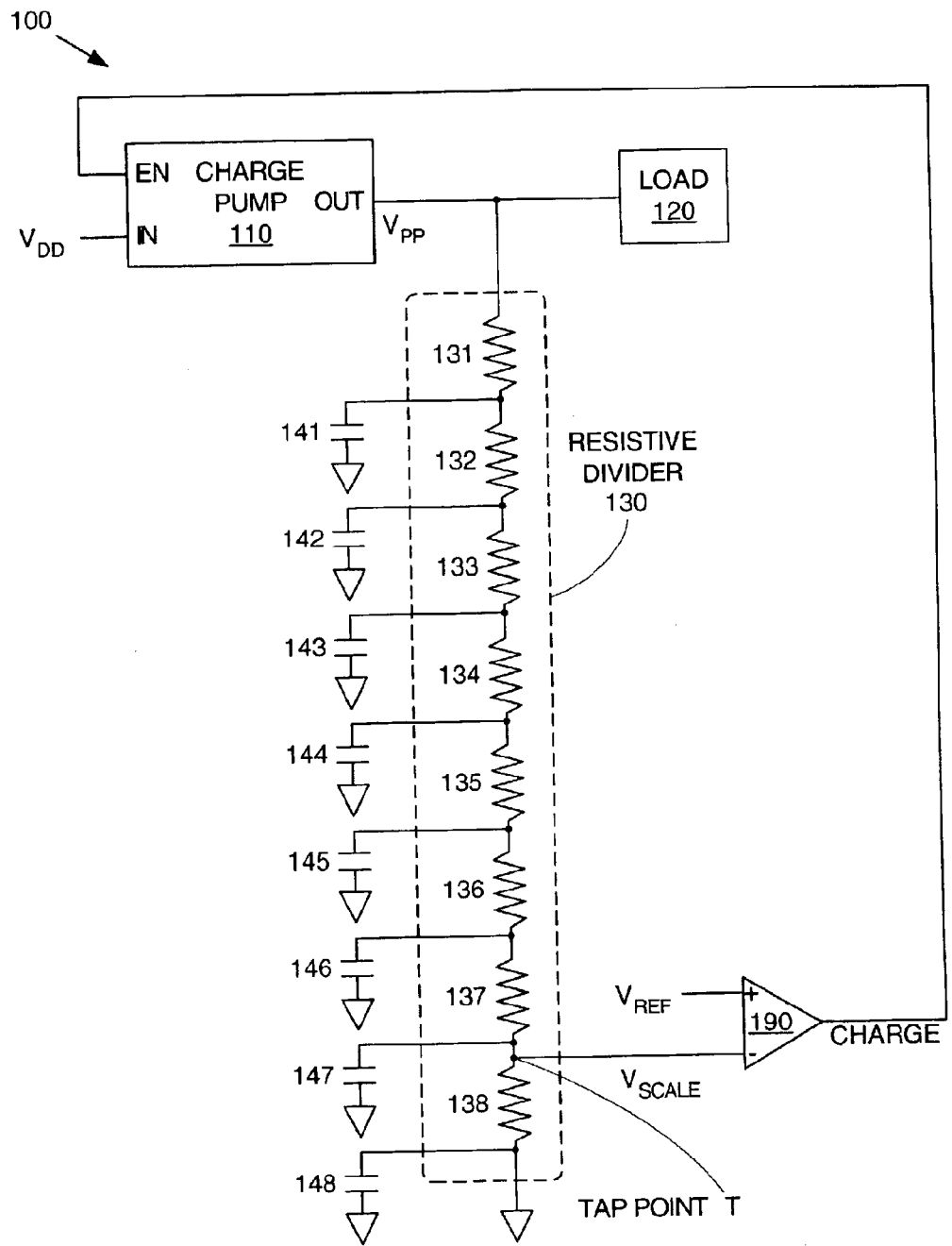
FIG. 1 is a schematic diagram of a conventional charge pump circuit, depicting the parasitic capacitance associated with the resistive divider in the feedback control circuit.
Figure 2:
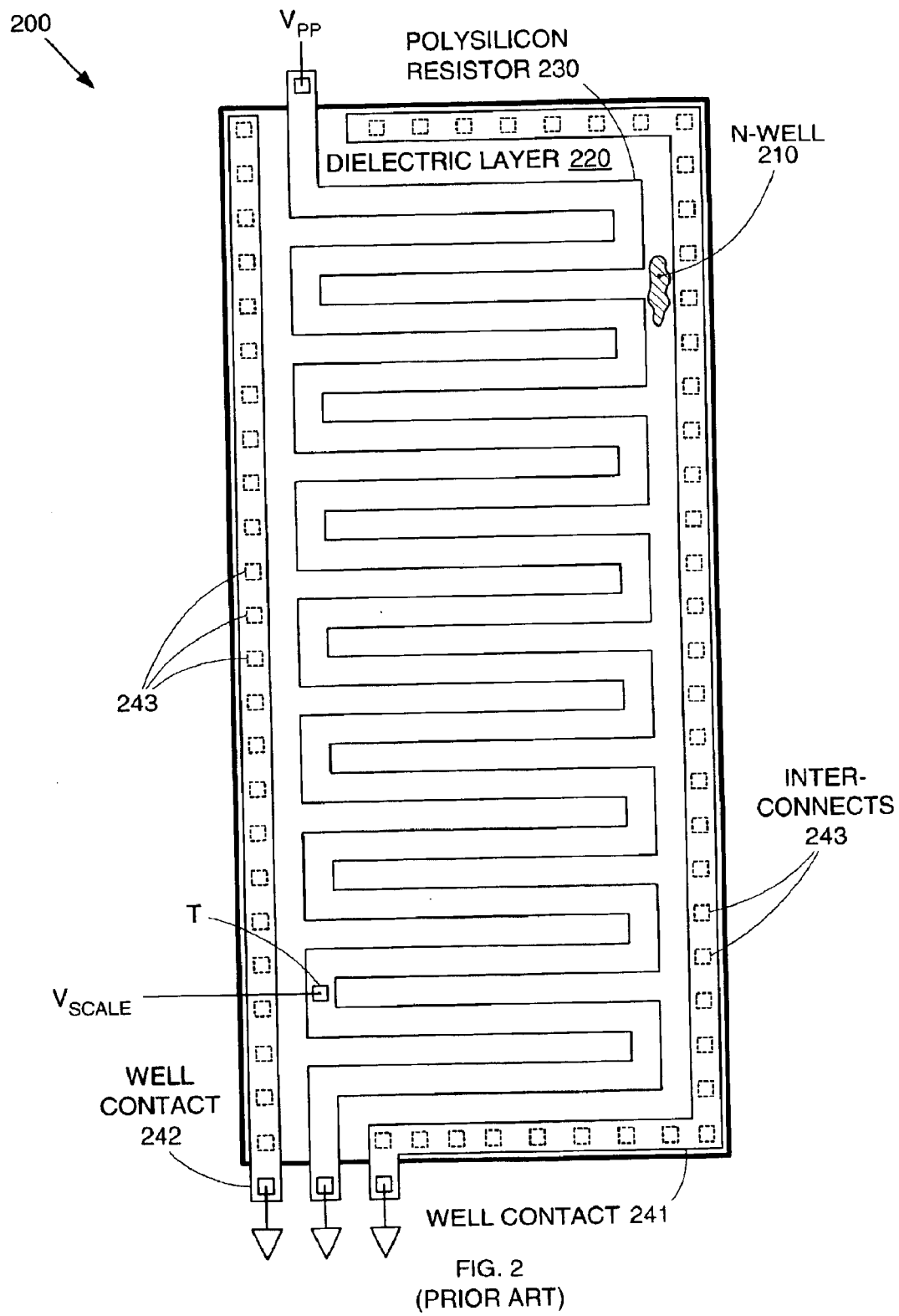
FIG. 2 is an IC layout for a conventional resistive divider for a charge pump circuit.
Figure 3:
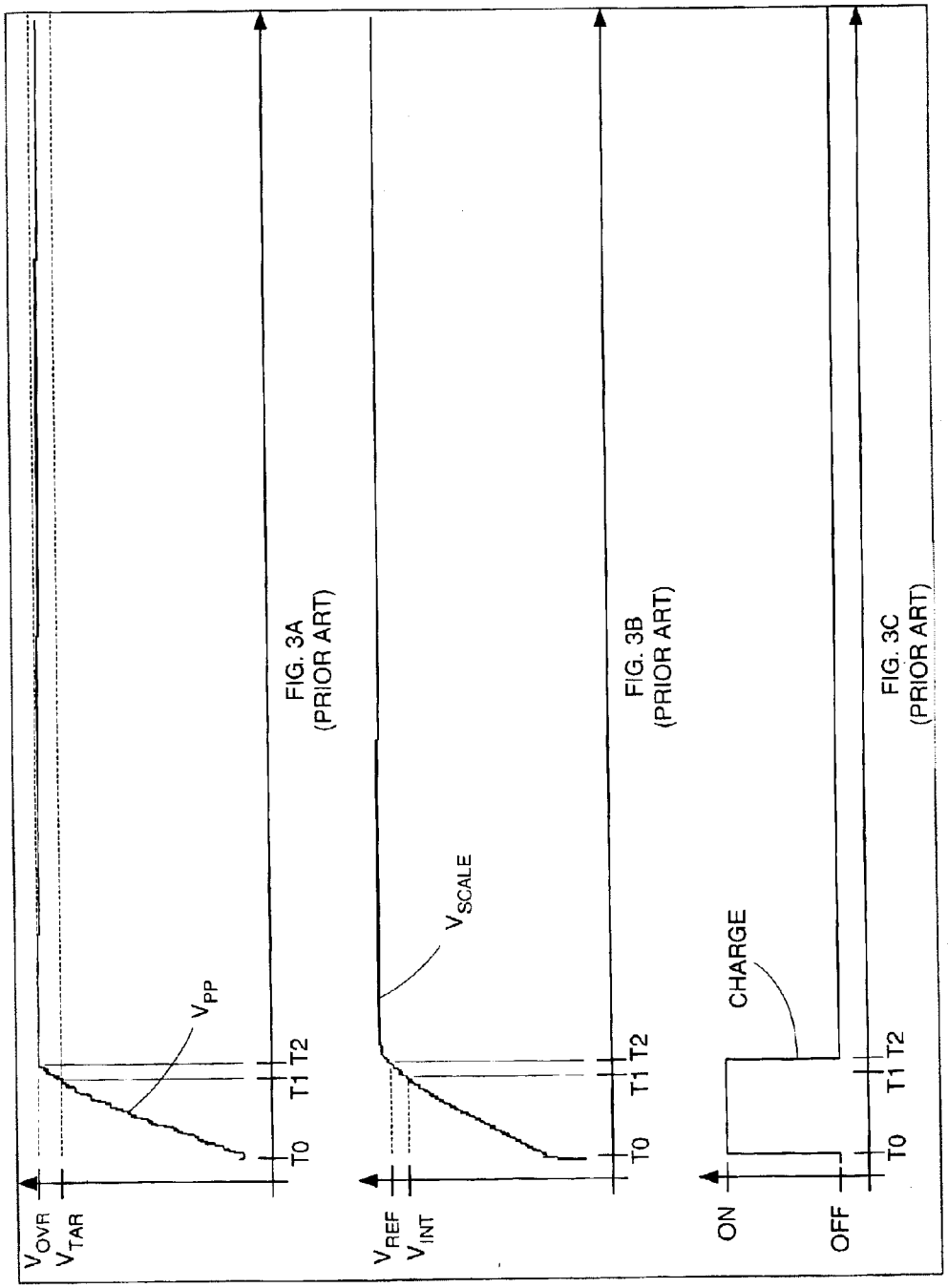
FIGS. 3A, 3B, and 3C are sample graphs of a charge pump output voltage, a comparison voltage, and a charge pump control signal, respectively, for a conventional charge pump circuit.

Like resistive divider 130 shown in FIG. 1, resistive divider circuit 430 scales elevated output voltage $V_{PP}$ into test voltage $V_{TEST}$ to enable monitoring of elevated output voltage $V_{PP}$. Control signal generator 450 performs this monitoring by comparing test voltage $V_{TEST}$ to a reference voltage $V_{REF}$. Reference voltage $V_{REF}$ is set equal to the predetermined steady state value of test voltage $V_{TEST}$ when elevated output voltage $V_{PP}$ is equal to a target output voltage $V_{TAR}$. For example, if test voltage $V_{TEST}$ is read from tap point $T_C$ (i.e., control signal CTC is asserted), and the resistances of resistors RD1–RD8 are all equal, the steady state value of test voltage $V_{TEST}$ when elevated output voltage $V_{PP}$ is equal to target voltage $V_{TAR}$ is one eighth of target voltage $V_{TAR}$. Accordingly, reference voltage $V_{REF}$ would be set equal to one eighth of target voltage $V_{TAR}$ under such circumstances.

Note that another method for ensuring the proper elevated voltage $V_{PP}$ output from voltage multiplier circuit 400 is to select the tap point from which $V_{TEST}$ is read according to a predetermined reference voltage $V_{REF}$. The specific position of the tap point along resistive divider circuit 430 determines the proportion of elevated output voltage $V_{PP}$ that test voltage $V_{TEST}$ represents. For example, for the same reference voltage $V_{REF}$, reading test voltage $V_{TEST}$ from tap point TB would result in a smaller final elevated output voltage $V_{PP}$ than would reading test voltage $V_{TEST}$ from tap point $T_C$, since the voltage at tap point $T_B$ represents a greater proportion of elevated output voltage $V_{PP}$ than does the voltage at tap point $V_C$.

Control signal generator 450 compares test voltage $V_{TEST}$ to reference voltage $V_{REF}$ to generate a charging control signal CHARGE, which is then provided to an enable terminal of charging circuit 410. Charging circuit 410 is also coupled to receive a supply voltage $V_{DD}$ at an input terminal IN. When charging control signal CHARGE is asserted, charging circuit 410 charges an internal capacitance (not shown for simplicity) to generate elevated output voltage $V_{PP}$ at an output terminal OUT. By controlling charging control signal CHARGE, control signal generator 450 controls the level of elevated output voltage $V_{PP}$.

To avoid the output voltage overshoot problems caused the transmission delays present in conventional resistive dividers, the parasitic capacitance, indicated by capacitors CP1, CP2, CP3, CP4, CP5, CP6, CP7, and CP8, associated with resistive divider circuit 430 is tied to elevated output voltage $V_{PP}$ rather than being grounded. Parasitic resistances RP1–RP8 represent the nominal resistances associated with the well and well contact structures used to provide this "well biasing." Well biasing significantly reduces voltage propagation delay through the resistive divider circuit, since the parasitic capacitors do not have to be charged by the voltage being applied across the resistive elements. Therefore, the rate at which test voltage $V_{TEST}$ increases is improved over conventional voltage divider circuits.

Because the well biasing capacitively couples the tap point (e.g., $T_A$, $T_B$, or $T_C$) of resistive divider circuit 430 to elevated output voltage $V_{PP}$, the parasitic capacitance at the tap point is charged by elevated output voltage $V_{PP}$. Because the parasitic capacitances (CP1–CP8) and the parasitic resistances (RP1–RP8) are small, this parasitic capacitive charging (and discharging) is very fast. Therefore, the rate of change of test voltage $V_{TEST}$ is much greater than the rate of change of elevated output voltage $V_{PP}$. Therefore, in contrast to conventional (grounded well) resistive divider circuits in which the reduced test voltage lags the elevated output voltage, a well-biased resistive divider circuit in accordance with the invention generates a test voltage that leads the elevated output voltage. In other words, until resistive divider circuit 430 reaches a steady state condition, test voltage $V_{TEST}$ will exceed reference voltage $V_{REF}$ before elevated output voltage $V_{PP}$ reaches target voltage $V_{TAR}$. Note that one or more tap points of resistive divider circuit 430 can be coupled to elevated output voltage $V_{PP}$ by using an explicit (or intentional) capacitor (instead of, or in addition to, using the parasitic capacitance of well biasing) to achieve the same benefits. Similarly, the parasitic resistances can be replaced with explicit resistors. Intentional capacitors and resistors are well known in the art and can be formed using techniques known to those of ordinary skill in the art. Note further that not every point along resistive divider circuit 430 must be coupled to $V_{PP}$. In some embodiments, one or more points can be connected to $V_S$, or any other voltage, as will be described in greater detail with respect to FIG. 7.

By avoiding the output voltage overshoot problems associated with conventional voltage multiplier circuits, voltage multiplier circuit 400 does not require customization to drive different types of loads. For example, even if load 420, alternative load 421 and alternative load 422 have substantially different current requirements, they all can be properly driven by voltage multiplier circuit 400.

Figures 5A, 5B, 5C:
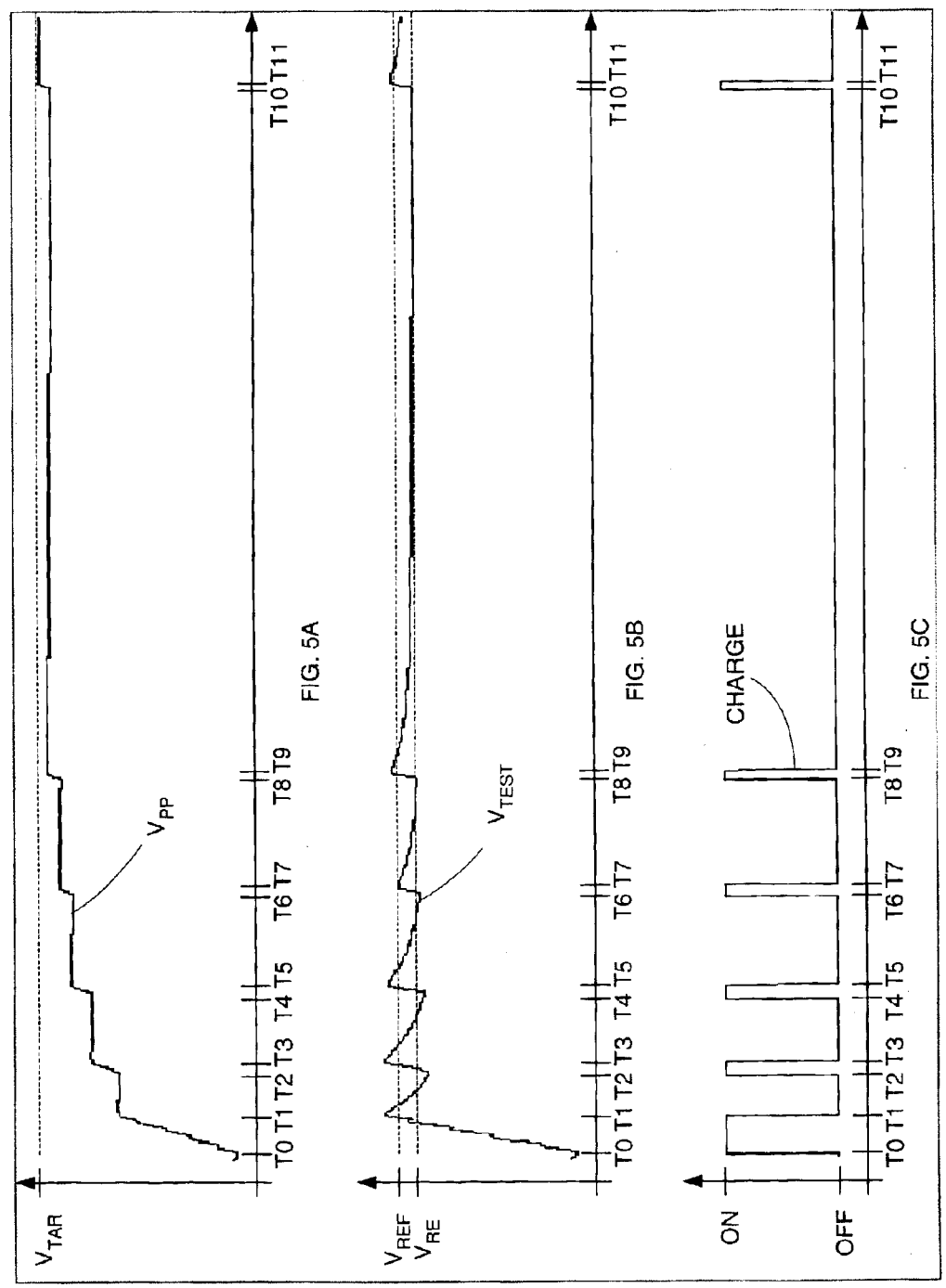
FIGS. 5A, 5B, and 5C are sample graphs of a voltage multiplier output voltage, a comparison voltage, and a voltage multiplier control signal, respectively, for a voltage multiplier circuit in accordance with an embodiment of the invention.

This behavior is depicted in FIGS. 5A, 5B, and 5C, which show sample graphs of elevated output voltage $V_{PP}$ versus time, and corresponding graphs of test voltage $V_{TEST}$ versus time and charging enable signal CHARGE versus time, respectively, for voltage multiplier circuit 400 shown in FIG. 4. When control signal generator 450 asserts charging enable signal CHARGE at a time T0 (as shown in FIG. 5C), elevated output voltage $V_{PP}$ begins rising as charging circuit 410 begins charging, as shown in FIG. 5A. As a result, test voltage $V_{TEST}$ read from well-biased voltage divider circuit 430 also begins rising, as shown in FIG. 5B. However, test voltage $V_{TEST}$ increases at a faster rate than does elevated output voltage $V_{PP}$, due to the combined voltage propagation and direct capacitive coupling effects described above. Therefore, when test voltage $V_{TEST}$ reaches reference voltage $V_{REF}$ at a time T1, causing control signal generator 450 to de-assert charging enable signal CHARGE and halt the charging action of charging circuit 410, elevated output voltage $V_{PP}$ is still well below target output voltage $V_{TAR}$.

Note that charging circuit 410 continues its charging operation for a short time after charging enable signal CHARGE is deasserted, due to delays in the logic of control signal generator 450 and/or charging circuit 410. Therefore, elevated output voltage $V_{PP}$ (and test voltage $V_{TEST}$) continue to rise for a brief period after charging enable signal CHARGE is deasserted. However, because this additional charging period has such a short duration, it does not significantly affect the magnitude of elevated output voltage $V_{PP}$.

Because test voltage $V_{TEST}$ is largely driven by capacitive charging during the charging interval between times T0 and T1, rather than voltage propagation through the resistive divider, test voltage $V_{TEST}$ rapidly decreases as the charge on the small parasitic capacitance quickly bleeds away through resistive divider circuit 430. Once test voltage $V_{TEST}$ falls below a resume voltage $V_{RE}$, control signal generator 450 reasserts charging enable signal CHARGE to resume the charging operation of charging circuit 410. Resume voltage $V_{RE}$ is typically determined by the hysteresis characteristics of control signal generator 450, and is therefore usually less than reference voltage $V_{REF}$ (by the amount of hysteresis). However, according to other embodiments of the invention, control signal generator 450 can reassert charging enable signal CHARGE as soon as test voltage $V_{TEST}$ falls below reference voltage $V_{REF}$.

Thus, at a time T2, after test voltage $V_{TEST}$ has fallen below resume voltage $V_{RE}$, control signal generator 450 reasserts charging enable signal CHARGE. This causes charging circuit 410 to resume its charging operation, and elevated output voltage $V_{PP}$ begins rising again. Note that for a short period after time T2, test voltage $V_{TEST}$ continues decreasing due to delays in control signal generator 450 and/or charging circuit 410. However, as elevated output voltage $V_{PP}$ continues to rise, test voltage $V_{TEST}$ quickly begins rising as well. Then, when test voltage $V_{TEST}$ reaches reference voltage $V_{REF}$ at time T3, charging enable signal CHARGE is deasserted, and the charging operation of charging circuit 410 is halted.

Just as at time T1, at time T3 elevated output voltage $V_{PP}$ is still less than target output voltage $V_{TAR}$. In this manner, with each subsequent charging interval (i.e., each period during which charging enable signal CHARGE is asserted, such as the intervals between times T4 and T5, times T6 and T7, times T8 and T9, and times T10 and T11) elevated output voltage $V_{PP}$ is pushed closer to target voltage $V_{TAR}$. By the time of the charging interval between times T10 and T11, elevated output voltage $V_{PP}$ is almost exactly equal to target voltage $V_{TAR}$. In this manner, elevated output voltage $V_{PP}$ is gradually "stepped" up to target voltage $V_{TAR}$, thereby avoiding the problematic overcharging of conventional voltage multiplier circuits.

Note that the closer elevated output voltage $V_{PP}$ gets to target voltage $V_{TAR}$, the more slowly test voltage $V_{TEST}$ decreases during non-charging intervals, since as elevated output voltage $V_{PP}$ rises, the proportion of test voltage $V_{TEST}$ provided by capacitive charging decreases. For example, the non-charging interval from time T1 to time T2 is relatively short, since test voltage $V_{TEST}$ is largely provided by charge buildup across the small parasitic capacitance, and the small charge buildup can be rapidly dissipated. However, the non-charging interval from time T9 to time T10 is relatively long, since by that time, test voltage $V_{TEST}$ is largely provided by the total voltage across the resistive divider, which is slow to dissipate due to the large resistances used in the resistive divider.

Figure 6:
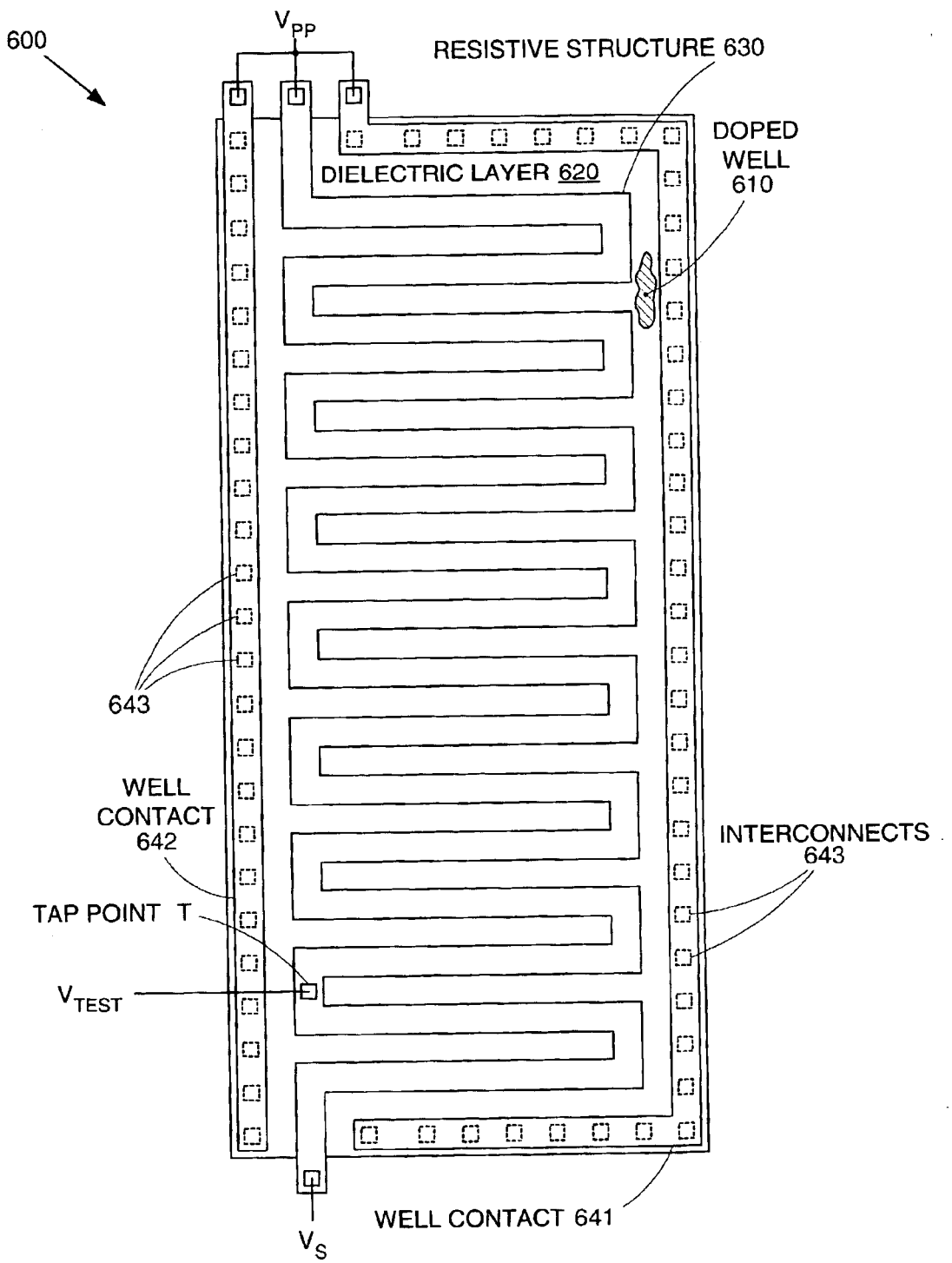
FIG. 6 is an IC layout for a resistive divider in accordance with an embodiment of the invention.

FIG. 6 shows an integrated circuit (IC) layout diagram for a resistive divider circuit 600 according to an embodiment of the invention. Resistive divider circuit 600 includes a resistive structure 630 (such as doped polysilicon) formed on a dielectric layer 620 over a doped well 610. The dopant configurations of resistive structure 630 and doped well 610 would generally be based on the characteristics of elevated output voltage $V_{PP}$. For example, resistive structure 630 could comprise a p+ polysilicon structure formed over an n-well when used with a positive elevated voltage $V_{PP}$. Alternatively, resistive structure 630 could comprise an n+ polysilicon structure formed over a p-well when used with a negative elevated voltage $V_{PP}$.

Resistive structure 630 is connected between an elevated output voltage $V_{PP}$ (such as the output of a charge pump) and a supply voltage $V_S$ (e.g., ground). Test voltage $V_{TEST}$ is read from a tap point T at an interior location of resistive structure 630, and is therefore determined by the specific location of tap point T along the length of resistive structure 630. The closer tap point T is to the end of resistive structure 630 that is connected to supply voltage $V_S$, the smaller test voltage $V_{TEST}$ becomes relative to elevated output voltage $V_{PP}$. For example, tap point T in FIG. 6 is seven eighths of the way from the end of resistive structure 630 connected to elevated output voltage $V_{PP}$ to the end connected to supply voltage $V_S$. Therefore, in a steady state condition, test voltage $V_{TEST}$ read from tap point T would be equal to one eighth of elevated output voltage $V_{PP}$ (although as described above, this would not necessarily be the case during charging operations).

The multiple bends of resistive structure 630 can correspond to resistors RD1–RD8 shown in FIG. 4. However, note that while a serpentine layout for resistive structure 630 is depicted in FIG. 6 for explanatory purposes, resistive structure 630 can take any shape. Well contacts 641 and 642, which are formed on dielectric layer 620 but are connected to doped well 610 by a plurality of interconnects 643, are both tied to elevated output voltage $V_{PP}$. Note that while well contacts 641 and 642 are depicted as surrounding resistive structure 630 to enhance the well biasing, various other well contact configurations can be implemented according to additional embodiments of the invention. In this manner, a well-biased resistive divider structure can be constructed.

Figure 7:
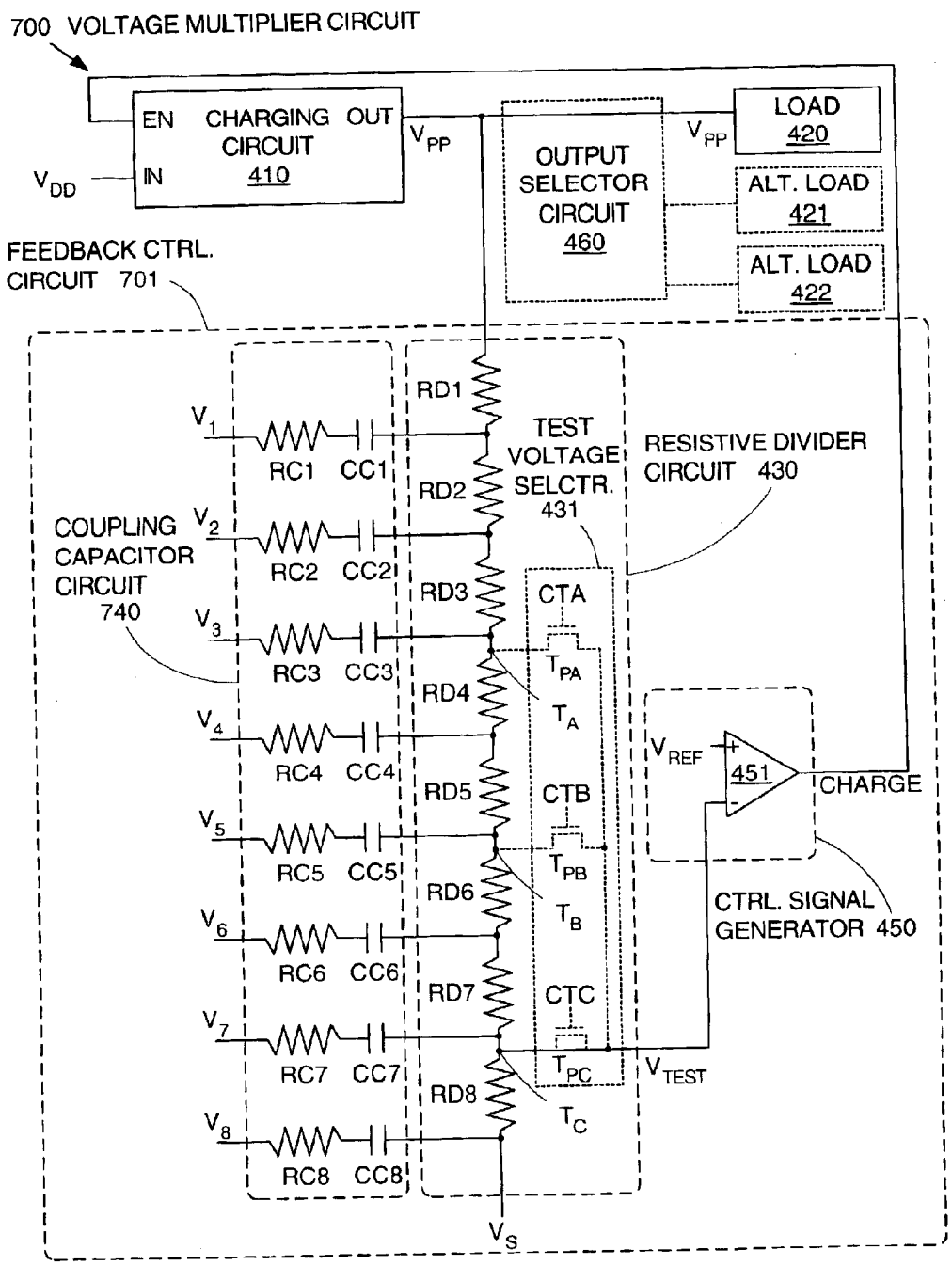
FIG. 7 is a schematic diagram of a voltage multiplier circuit in accordance with an embodiment of the invention.

FIG. 7 shows a circuit diagram of a voltage multiplier circuit 700 in accordance with an embodiment of the invention. Voltage multiplier circuit 700 is similar to voltage multiplier circuit 400 of FIG. 4. As shown in FIG. 7, voltage multiplier circuit 700 includes a feedback control circuit 701 for regulating the charging operation of charging circuit 410. Feedback control circuit 701 comprises a resistive divider circuit 430 that is coupled to a capacitance coupling circuit 740.

Capacitance coupling circuit 740 comprises capacitors CC1, CC2, CC3, CC4, CC5, CC6, CC7, and CC8, and resistors RC1, RC2, RC3, RC4, RC5, RC6, RC7, and RC8. Note that while eight capacitors and eight resistors are shown, capacitance coupling circuit 740 can comprise any number of capacitors and resistors. In some embodiments, capacitors CC1–CC8 and resistors RC1–RC8 can be parasitic capacitances and resistances. In other embodiments, as noted above with respect to FIG. 4, one or more of capacitors CC1–CC8 and/or resistors RC1–RC8 can be explicit capacitors and/or resistors. As shown in FIG. 7, each of capacitor-resistor pairs CC1–RC1 through CC8–RC8 can be coupled to a voltage $V_1$–$V_8$, respectively. For example, voltages $V_1$–$V_8$ can be equal to $V_{PP}$, $V_S$, another voltage that is available on the IC, or any combination thereof. This allows voltage multiplier circuit 700 to be tuned to particular performance requirements. In a preferred embodiment, voltages $V_1$–$V_8$ are derived from or related to voltage $V_{PP}$. For example, a voltage $V_{PP}/2$ that has a voltage swing of 0V to $V_{PP}/2$ can be used.

Specifically, there is a tradeoff between the rise time of $V_{PP}$ and the voltage overshoot, depending on the voltage swing of voltages $V_1$–$V_8$. In general, coupling to a voltage having a large voltage swing (e.g., 0V to $V_{PP}$) results in a slower rise time for elevated output voltage $V_{PP}$, with less overshoot. Conversely, coupling to a voltage having a smaller voltage swing (e.g., 0V to $V_{PP}/2$), or to a DC voltage (e.g., 0V) results in a faster rise time with greater overshoot. Also, coupling more of the voltages $V_1$–$C_8$ to a particular (large or small) voltage swing increases the effects of that voltage swing on rise time and overshoot, and coupling fewer of the voltages $V_1$–$V_8$ reduces such effects. Thus, the rise time and the overshoot for elevated output voltage $V_{PP}$ of voltage multiplier circuit 700 can be optimized for the particular application in which voltage multiplier circuit 700 will be used. Moreover, the voltage swings of each of the voltages $V_1$–$V_8$ can be made selectable, for example by using trim circuits, metal options, or configuration bits. This allows for greater flexibility in optimizing the performance of voltage multiplier circuit 700.

Although the present invention has been described in connection with a single voltage multiplier circuit (i.e., a first voltage multiplier circuit), it is understood that more than one voltage multiplier circuit can be implemented in other embodiments. Thus, a second voltage multiplier circuit can include a second charging circuit for generating a second elevated voltage at a second output terminal, wherein the second elevated voltage is different from the first elevated voltage ($V_{PP}$) generated by the first charging circuit in the first voltage multiplier circuit. The second voltage multiplier circuit also includes a second doped well coupled to the second output terminal, and a second dielectric layer located over the second doped well. A second resistive structure is located over the second dielectric layer, wherein the second resistive structure is coupled between the second output terminal and the ground supply terminal. The second resistive structure can have the same resistance as the first resistive structure in the first voltage multiplier circuit. The second voltage multiplier circuit also includes a second control signal generator, which compares a second test voltage taken from a selected location on the second resistive structure to the same reference voltage ($V_{REF}$) used by the first voltage multiplier circuit, thereby generating a second charging enable signal. The second charging enable signal is used to control the operation of the second charging circuit.

The various embodiments of the structures and methods of this invention that are described above are illustrative only of the principles of this invention and are not intended to limit the scope of the invention to the particular embodiments described. Thus, the invention is limited only by the following claims and their embodiments.

What is claimed is:

1. A voltage multiplier circuit comprising:
   a charging circuit including an input terminal for receiving an input voltage and an output terminal for providing an elevated output voltage, a magnitude of the elevated output voltage being greater than a magnitude of the input voltage;
   a doped well coupled to the output terminal;
   a dielectric layer located over the doped well; and
   a resistive divider coupled between the output terminal and a supply terminal, the resistive divider being located over the dielectric layer.

2. The voltage multiplier circuit of claim 1, further comprising a control signal generator for comparing a test voltage from a selected location on the resistive divider to a reference voltage to generate a charging enable signal, the charging enable signal controlling the operation of the charging circuit.

3. The voltage multiplier circuit of claim 2, wherein the control signal generator asserts the charging enable signal when a magnitude of the test voltage is less than a magnitude of a first reference voltage, and wherein the control signal generator deasserts the charging enable signal when the test voltage reaches a second reference voltage, the magnitude of the first reference voltage being less than or equal to a magnitude of the second reference voltage.

4. The voltage multiplier circuit of claim 3, wherein the control signal generator comprises a comparator, the comparator including:
   a first input terminal coupled to receive the test voltage;
   a second input terminal coupled to receive the first reference voltage; and an output terminal for providing the charging enable signal.

5. The voltage multiplier circuit of claim 4, the comparator having hysteresis equal to the second reference voltage subtracted from the first reference voltage.

6. The voltage multiplier circuit of claim 2, wherein the voltage multiplier circuit includes a tap selection circuit for selecting the selected location on the resistive divider from a plurality of locations on the resistive divider.

7. The voltage multiplier circuit of claim 6, wherein the tap selection circuit comprises a plurality of pass transistors, each of the plurality of pass transistors being coupled between one of the plurality of locations on the resistive divider and the control signal generator, wherein the tap selection circuit asserts an enable signal at a control terminal of a selected one of the plurality of pass transistors to provide the test voltage.

8. The voltage multiplier circuit of claim 1, further comprising an output selection circuit for selectively connecting the output terminal of the charging circuit to either a first output load or a second output load.

9. The voltage multiplier circuit of claim 8, wherein the first output load has a first current requirement and the second output load has a second current requirement, the first current requirement being different from the second current requirement.

10. A resistive divider comprising:
  an input terminal for receiving a first voltage;
  an output terminal for receiving a second voltage, wherein a magnitude of the first voltage is greater than a magnitude of the second voltage;
  a doped well coupled to the input terminal;
  a dielectric layer located over the doped well;
  a resistive structure connecting the input terminal and the output terminal, the resistive structure being located over the dielectric layer; and
  a test terminal for reading a scaled voltage from a selected location on the resistive structure.

11. The resistive divider of claim 10, wherein the resistive structure comprises a p+ polysilicon structure and the doped well comprises an n-well.

12. The resistive divider of claim 10, wherein the resistive structure comprises an n+ polysilicon structure and the doped well comprises a p-well.

13. The resistive divider of claim 10, further comprising at least one well contact formed over the dielectric layer, the at least one well contact being coupled to the input terminal, and the at least one well contact also being coupled to the doped well by a plurality of interconnects.

14. The resistive divider of claim 13, wherein the resistive structure has a serpentine shape, and wherein the at least one well contact surrounds the resistive structure.

15. An integrated circuit (IC) comprising:
  circuitry requiring a voltage higher than a supply voltage; and
  a first voltage multiplier circuit, the first voltage multiplier circuit comprising:
    a first charging circuit for generating a first elevated voltage at a first output terminal;
    a first doped well coupled to the first output terminal;
    a first dielectric layer located over the first doped well; and
    a first resistive structure located over the first dielectric layer, the first resistive structure being coupled between the first output terminal and a supply terminal.

16. The IC of claim 15, wherein the first voltage multiplier circuit further comprises a first control signal generator for comparing a first test voltage from a first selected location on the first resistive structure to a first reference voltage to generate a first charging enable signal, the first charging enable signal controlling the operation of the first charging circuit.

17. The IC of claim 16, wherein the first control signal generator comprises a comparator, the comparator including:
  a first input terminal coupled to receive the first test voltage;
  a second input terminal coupled to receive the first reference voltage; and
  a comparator output terminal for providing the first charging enable signal.

18. The IC of claim 16, wherein when the first control signal generator asserts the first charging enable signal when a magnitude of the first test voltage is less than a magnitude of the first reference voltage, and wherein the first control signal generator deasserts the first charging enable signal when the magnitude of the first test voltage reaches a magnitude of a second reference voltage, the magnitude the first reference voltage being less than or equal to the magnitude of the second reference voltage.

19. The IC of claim 16, wherein the first voltage multiplier circuit further includes a tap selection circuit for selecting the first selected location on the first resistive structure from a plurality of locations on the first resistive structure.

20. The IC of claim 16, further comprising a second voltage multiplier circuit, the second voltage multiplier circuit comprising:
  a second charging circuit for generating a second elevated voltage at a second output terminal, the second elevated voltage being different from the first elevated voltage;
  a second doped well coupled to the second output terminal;
  a second dielectric layer located over the second doped well;
  a second resistive structure located over the second dielectric layer, the second resistive structure being coupled between the second output terminal and the supply terminal, the second resistive structure having a second resistance, the second resistance being equal to a first resistance of the first resistive structure; and
  a second control signal generator for comparing a second test voltage from a second selected location on the second resistive structure to the first reference voltage to generate a second charging enable signal, the second charging enable signal controlling the operation of the second charging circuit.

21. The IC of claim 15, wherein the first voltage multiplier circuit further comprises an output selection circuit for selectively connecting the first output terminal of the first charging circuit to one of a plurality of output loads.

22. A method for generating an elevated voltage, the method comprising:
  performing a charging operation to generate an output voltage in response to an input voltage, a magnitude of the output voltage being greater than a magnitude of the input voltage;
  applying the output voltage to a resistive divider to generate a scaled test voltage, the scaled test voltage changing more rapidly than the output voltage; and
  comparing the test voltage to a reference voltage to generate a control signal for regulating the charging operation.

23. The method of claim 22, further comprising capacitively coupling the resistive divider to the output voltage.

24. The method of claim 23, wherein the resistive divider comprises a resistive structure located over a dielectric layer, the dielectric layer being located over a doped well, and wherein capacitively coupling the resistive divider to the output voltage comprises coupling the doped well to the output voltage.

25. A voltage regulating circuit comprising:
 a charging circuit providing an output voltage $V_{PP}$;
 a resistive divider connected between $V_{PP}$ and a second voltage, the resistive divider having a plurality of taps for taking a voltage intermediate between $V_{PP}$ and the second voltage;
 a control signal generator receiving a reference voltage and a voltage derived from one of the taps and providing a control signal for controlling the charging circuit; and
 a capacitor connected between the one of the taps and a third voltage, wherein the third voltage is derived from or related to the output voltage $V_{PP}$.

26. The voltage regulating circuit of claim 25, wherein the third voltage is equal to $V_{PP}$.

27. The voltage regulating circuit of claim 25, further comprising a resistance between the capacitor and the third voltage.

28. The voltage regulating circuit of claim 27, wherein the resistance is a parasitic resistance.

29. The voltage regulating circuit of claim 25, wherein the capacitor is a parasitic capacitance.

30. The voltage regulating circuit of claim 25, wherein the capacitor connected between the one of the taps and the third voltage is a plurality of capacitors connected between each of the taps and a plurality of voltages.

31. The voltage regulating circuit of claim 30, wherein each of the plurality of voltages is equal to $V_{PP}$.

32. The voltage regulating circuit of claim 30, further comprising a plurality of resistances between the plurality of capacitors and the plurality of voltages.

33. The voltage regulating circuit of claim 32, wherein the plurality of resistances are parasitic resistances.

34. The voltage regulating circuit of claim 30, wherein the plurality of capacitors are parasitic capacitances.

* * * * *

UNITED STATES PATENT AND TRADEMARK OFFICE
CERTIFICATE OF CORRECTION

PATENT NO.     : 6,861,895 B1
DATED          : March 1, 2005
INVENTOR(S)    : Ping-Chen Liu et al.

It is certified that error appears in the above-identified patent and that said Letters Patent is hereby corrected as shown below:

<u>Title page,</u>
Item [73], Assignee, insert -- Xilinx, Inc., San Jose, CA (US) --

Signed and Sealed this

Fifth Day of July, 2005

JON W. DUDAS
*Director of the United States Patent and Trademark Office*